United States Patent
Ragot et al.

(10) Patent No.: US 8,285,544 B2
(45) Date of Patent: Oct. 9, 2012

(54) RESTRAINED VECTOR QUANTISATION

(75) Inventors: Stéphane Ragot, Lannion (FR); Cyril Guillaume, Beaurepaire (FR)

(73) Assignee: France Telecom, Paris (FR)

( * ) Notice: Subject to any disclaimer, the term of this patent is extended or adjusted under 35 U.S.C. 154(b) by 1053 days.

(21) Appl. No.: 12/225,312

(22) PCT Filed: Mar. 9, 2007

(86) PCT No.: PCT/FR2007/050908
§ 371 (c)(1),
(2), (4) Date: Sep. 18, 2008

(87) PCT Pub. No.: WO2007/107659
PCT Pub. Date: Sep. 27, 2007

(65) Prior Publication Data
US 2010/0228808 A1      Sep. 9, 2010

(30) Foreign Application Priority Data
Mar. 21, 2006   (FR) ..................... 06 02452

(51) Int. Cl.
*G10L 19/00*  (2006.01)
*G10L 21/00*  (2006.01)

(52) U.S. Cl. ...................... 704/230; 704/201

(58) Field of Classification Search ............ 704/201, 704/230
See application file for complete search history.

(56) References Cited

OTHER PUBLICATIONS

Scheunders P: "A genetic Lloyd-Max image quantization algorithm" Pattern Recognition Letters, North-Holland Publ. Amsterdam, NL, vol. 17, No. 5, May 1, 1996, pp. 547-556, XP004017944, ISSN: 0167-8655 The whole document.

Anonymous: "Just noticeable difference" Wikipedia Article, Mar. 18, 2006, XP002394603, Retrieved from the Internet: URL:http://en.wikipedia.org/w/index.php?title=Justnoticeable_difference&oldid=44358293>[retrieved on Aug. 11, 2006] The whole document.

Ted Painter, Andreas Spanias: "Perceptual Coding of Digital Audio" [Online] Apr. 2000, XP002394604, Retrieved from the Internet: URL:http://www.eas.asu.edu/{spanias/papers/paper-audio-tedspanias-00.pdf [retrieved on Aug. 11, 2006] Proceedings of the IEEE, vol. 88, No. 4, Apr. 2000 The whole document.

*Primary Examiner* — Justin Rider
(74) *Attorney, Agent, or Firm* — McKenna Long & Aldridge LLP (57) ABSTRACT

The invention relates to a method for generating a vector quantization dictionary for a signal, of the type comprising a statistical analysis of driving vectors representing the signal determining a finite set of code vectors which are proxies for the said driving vectors, wherein the method also comprises modifying the said finite set of code vectors to impose a minimum distance between the modified code vectors two by two, these modified code vectors forming the said dictionary.

21 Claims, 5 Drawing Sheets

RESTRAINED VECTOR QUANTISATION

This application is a 35 U.S.C. §371 National Stage entry of PCT/FR2007/050908, filed on Mar. 9, 2007, and claims priority to French Application No. FR0602452, filed on Mar. 21, 2006, both of which are hereby incorporated by reference in their entireties.

The present invention relates to quantization dictionaries for encoding and decoding signals such as audio and video signals, and more generally multimedia signals, with a view to storing or transmitting them.

More precisely, the present invention proposes a solution to the problem of non-structured statistical vector quantization including a priori knowledge of a distortion threshold.

BACKGROUND OF THE INVENTION

A very widespread solution for processing signals, in particular digital signals, is vector quantization (VQ), which in general represents an input vector by a vector of the same dimension chosen from a finite set. This finite set is called the reproduction alphabet or dictionary or directory, and its elements are called code vectors, code words, output points or proxies.

In vector quantization, a block of n samples of a signal is treated like a vector of dimension n. The vector is encoded by choosing, from a finite dictionary, the code vector which most "resembles" it. For example, an exhaustive search is carried out among all the elements of the dictionary in order to select the dictionary element which minimizes a measure of distance between this element and the input vector.

In general, vector quantization dictionaries are designed on the basis of the analysis of samples of the signal which is to be encoded and forms a driving sequence or training sequence, using statistical methods such as the generalized Lloyd-Max algorithm (GLA) or the LBG (for Linde, Buzo and Gray) algorithm. Such a type of algorithm is described, for example, in the work by Gersho A., Gray R. M, "Vector Quantization and Signal Compression", Kluwer Academic Publishers, 1992.

From the driving sequence and an initial dictionary, the dictionary is constructed iteratively. Each iteration comprises a step of classification of the driving vectors in order to construct regions of quantization of the driving sequence according to the nearest neighbour rule, and a step of improvement of the dictionary by replacing the former code vectors by the centroids of the regions, according to the rule called the centroid rule.

In order to avoid convergence towards a local minimum of this deterministic iterative algorithm, variants termed stochastic relaxation (SKA: Stochastic K-means algorithm) have been proposed, introducing a random part into the step of centroid construction and/or that of class construction. Such a modification is described, for instance, in the publication by Kovesi, B.; Saoudi, S.; Boucher, J. M.; Reguly, Z., "A fast robust stochastic algorithm for vector quantizer design for nonstationary channels", IEEE International Conference on Acoustics, Speech, and Signal Processing, Vol. 1, pp. 269-272, 1995.

Dictionaries, or statistical vector quantizers, which are obtained in this way have no particular structure, which makes exploring them expensive in terms of calculation and in terms of memory. In fact, the use of such dictionaries obtained by traditional statistical vector quantization is often limited, particularly in real time, to encoding of low dimensions and/or low rates, of the order of 4 to 10 bits per vector.

In general, statistical vector quantization exploits the shape of the probability distribution of the signal to be processed, and that is found again in the distribution of the code vectors of the dictionary of a statistical vector quantizer. The construction algorithms which are used in vector quantization are aimed at minimizing the mean distortion; they therefore tend to place many code vectors in areas of high density. This concentration of centroids in areas of high density of the signal to be encoded is not always relevant from a perceptual point of view. It is thus possible that two code vectors of an area of high density are so close that the distortion which is generated by the substitution of one for the other is imperceptible.

In addition, for low-resolution quantizers, i.e. those with few code vectors, this concentration occurs to the detriment of less dense areas of the probability distribution of the signal to be encoded, said areas being badly represented, i.e. badly encoded.

For freedom from the constraints of size and dimension, several variants of statistical vector quantization were developed, in particular to attempt to remedy the dictionary's lack of a structure, and thus to reduce the complexity to the detriment of the quality. However, the performance-complexity compromise is improved, which makes it possible to increase the range of resolutions and/or dimensions over which vector quantization can be applied effectively. Many schemes for constrained vector quantizers have been proposed in the literature; in particular, the tree vector quantizer, the multi-stage vector quantizer, the "cartesian product" vector quantizer or the "gain/orientation" vector quantizer, which is a special case of the cartesian product vector quantizer.

As in unstructured vector quantization, dictionaries which are obtained by constrained methods always have a significant quantity of code vectors which are close to each other, and in particular code vectors of which the differences are imperceptible to the receiver. This results in a non-optimal quality.

Another approach, called algebraic vector quantization, has also been proposed. Algebraic vector quantization uses highly structured dictionaries from regular lattices of points or error correction codes. A simple example of a regular lattice is the cubic lattice, which is formed from a set of points with integer co-ordinates, for example.

By virtue of the algebraic properties of their dictionaries, algebraic vector quantizers are easy to implement and do not have to be stored in memory. Exploitation of the regular structure of these dictionaries makes it possible to develop optimal, fast search algorithms and mechanisms for associating the index with a corresponding code vector, e.g. by a formula.

The techniques which have been developed in the prior art for algebraic vector quantization result in dictionaries which are subsets of regular lattices or arrays.

One of the principal parameters of a regular lattice is its minimum square distance between two points on which the code vectors are placed. In order to simplify indexation, the dictionary is generally chosen as the intersection of the lattice with a regular polytope such as a hypercube or hypersphere, or with its surface. The points outside this intersection are then outliers. For a given rate, i.e. a fixed number of intersection points, limiting the number of outliers results in an increase in the minimum distance between two code vectors.

Whereas algebraic vector quantizers are less complex to implement and require less memory, they are optimal only for encoding signals with a uniform distribution.

It should also be noted that operations for indexing code vectors, or numbering, and inverse operations for decoding require more calculations than in the case of statistical vector quantizers, for which these operations are carried out simply by reading from tables.

Finally, another form of vector quantization combines algebraic and statistical quantization. This is true of fine-coarse vector quantization as described in the publication by Moayeri, N., Neuhoff D. L.; Stark, W. E., "Fine-coarse vector quantization", IEEE Trans. on Information Theory, Vol. 37, Issue 4, pp. 1503-1515, July 1991. This quantization includes two quantizers. The first, high-resolution or fine-resolution quantizer is in general well structured and not complex to implement, whereas the second, coarse-resolution quantizer is an unstructured statistical vector quantizer. The first stage is for precalculation, to make the search in the second stage faster.

SUMMARY OF THE INVENTION

The "fine-coarse" quantizer has the same drawbacks as those indicated above for statistical vector quantization. In fact, the link between the fine-resolution quantizer and the coarse-resolution quantizer is a simple correspondence table, so that even if the high-resolution vector quantizer is a finite subset of a regular lattice with a minimum distance between the code vectors, this constraint is not imposed on the coarse-resolution vector quantizer, which is constructed by the standard techniques of statistical vector quantization.

It thus appears that statistical vector quantization results in dictionaries of which the distribution of points is unsuitable, some of these points being redundant because they are imperceptible at the level of the receiver.

On the other hand, algebraic vector quantization results in dictionaries of which the distribution is suitable only for signals with a uniform probability distribution, and results in degrading the coding quality for other signals.

The invention has the particular advantage of defining a suitable method of obtaining a dictionary by statistical vector quantization suitable for the signal to be encoded, and taking account of the perceptual thresholds.

For this purpose, a subject of the invention is a method of generating a vector quantization dictionary for a signal, of the type comprising a step of statistical analysis of driving vectors representing the signal determining a finite set of code vectors which are proxies for said driving vectors, characterized in that the method also includes a step for modifying the said finite set of code vectors in order to impose a minimum distance between the modified code vectors two by two, these modified vectors forming the said dictionary.

Thus, the invention results in a dictionary which is suitable for the signal because of a step of statistical analysis of the driving vectors, but with a minimum distance between the code vectors, which makes it possible to take account of the fact that code vectors which are too close are indistinguishable at the level of perception.

According to other characteristics of the invention, the statistical analysis step comprises a sub-step for creating an initial dictionary, a sub-step for classifying the driving vectors from the initial dictionary in order to form quantization regions, and a sub-step for determining a centroid for each region, the said centroids being the said code vectors. Such an embodiment corresponds to a particular implementation of statistical analysis.

Advantageously, the said sub-step for creating an initial dictionary is implemented starting from the said driving vectors, and comprises replacement of each driving vector by a rounded vector which is chosen on a regular lattice of points, and selective elimination of rounded vectors as a function of their frequency of appearance.

In a particular embodiment of the invention, the statistical analysis step also includes a sub-step for calculating the distortion of the initial dictionary and a sub-step for comparing this distortion with a tolerance threshold, the said statistical analysis step being repeated if the said comparison is negative. Such an iterative approach makes it possible to obtain an initial dictionary of better quality.

In a variant, the modification step comprises replacing each of the said code vectors by a neighbouring code vector which is chosen on a regular lattice of points. Such an embodiment makes it possible to ensure a minimum distance between the code vectors.

Advantageously, the method also comprises a step for eliminating duplicates among the said modified code vectors, the result of which is to reduce the size of the dictionary.

In a particular embodiment, the step for eliminating duplicates includes a sub-step for searching for duplicates by comparing the modified code vectors with each other, and a sub-step for deleting the duplicates.

Advantageously, the method comprises a step for merging the modified code vectors with the driving vectors which have at least the said minimum distance between them, and with the said modified code vectors, in order to improve the distribution of the code vectors of the dictionary.

In a particular embodiment, this merging step comprises a sub-step for replacing each driving vector by a rounded vector which is chosen on a regular lattice of points, and a sub-step for combining the modified code vectors and rounded driving vectors. Thus, the rounded driving vectors which are combined with the modified code vectors also have a minimum distance two by two.

In another variant, the said merging step also comprises ordering the rounded driving vectors according to their frequency of appearance, and selecting a finite number of these vectors to combine them with the modified code vectors.

In an embodiment, the said combination sub-step comprises adding to the said modified code vectors a finite number of rounded driving vectors, which are distinct from the said modified code vectors.

In a variant, the regular lattice of points has a pitch which corresponds to a level of sensitivity of a receiver which is the destination of the said signal, which makes it possible to impose a minimum distance between two code vectors, corresponding to a perceptual reality.

In another embodiment, the method also comprises a phase for optimization of the said dictionary.

For example, the optimization phase comprises a step for calculating the distortion of the dictionary, and a step for comparing this distortion with a tolerance threshold, the said statistical analysis and modification steps being repeated if the said comparison is negative.

Alternatively, the optimization phase comprises at least one iteration of the method which is implemented on the basis of the dictionary which is formed from the said modified code vectors.

Another subject of the invention is a computer program comprising code instructions to implement the method as described above, and a device comprising means such as, for example, a working memory and a processor, to execute this computer program and thus generate a vector quantization dictionary within the meaning of the invention.

This invention also aims at methods of encoding and decoding, and a decoder which uses a dictionary which is obtained according to the invention.

BRIEF DESCRIPTION OF THE DRAWINGS

The invention will be better understood in the light of the following description, which is given as a non-limiting example and refers to the attached figures, in which.

DESCRIPTION OF THE PREFERRED EMBODIMENTS

Figure 1:
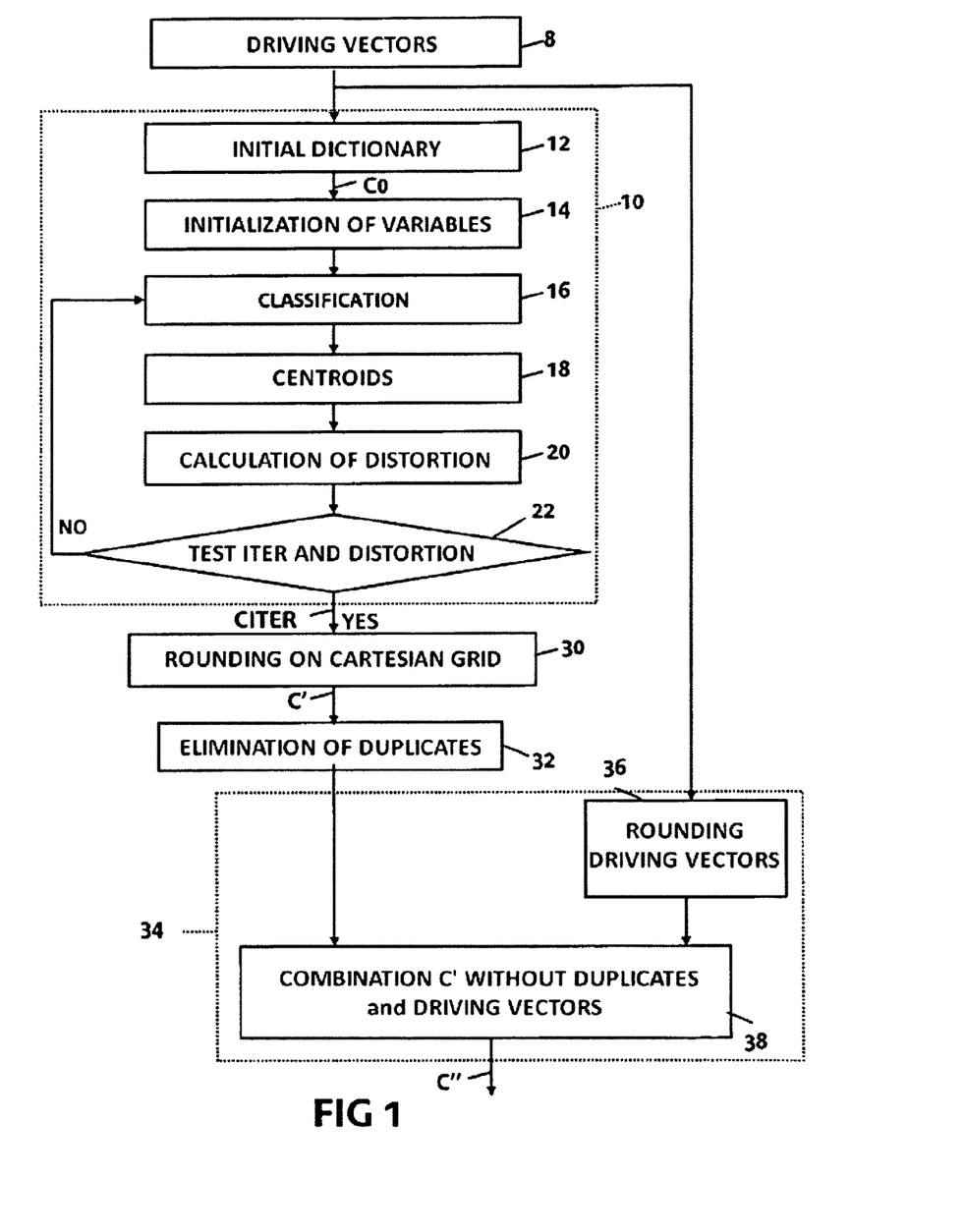
FIG. 1 is a flowchart of the method of the invention.

With reference to FIG. 1, a method of obtaining a vector quantization dictionary according to the invention will now be described.

In the described embodiment, this method is carried out on driving vectors which represent a digital audio signal such as a speech signal.

This method comprises, firstly, a step 10 of statistical analysis of the driving vectors. In the described embodiment, step 10 corresponds to the application of the generalized Lloyd-Max algorithm.

Step 10 begins with a sub-step 12 for creating an initial dictionary, marked C0. This dictionary is created from analysis of the driving vectors or by other means which are known per se such as random selection of a finite number of driving vectors, or algorithms called "splitting", "LBG algorithm", or other. This initial dictionary C0 is of determined size.

In the described embodiment, the method then comprises a sub-step 14 for initializing current variables, and in particular initializing a variable ITER corresponding to an iteration number, and a variable DITER corresponding to a distortion value.

Step 10 then comprises a sub-step 16 for classifying the driving vectors in relation to the initial dictionary C0, in order to form classification regions, and a sub-step 18 for determining a centroid for each region.

More precisely, in the classification sub-step 16, for each driving vector, the whole of the current dictionary is run through, i.e. the dictionary C0 modified by successive iterations, and the code vector which minimises the square error with the driving vector is chosen from the dictionary.

Sub-step 18 is implemented as follows: for each class or region Vi, new centroids are calculated.

Vi is defined as the set of driving vectors xj which verify Q(xj)=yi, where Q( ) is the quantization function and yi is a code vector of the dictionary.

Let Ni be the number of vectors of Vi, and Vi(j,k) be the kth element of the jth vector of Vi.

For the kth element of the centroid yi:

$$y_i[k] = \frac{1}{N_i} \sum_{j=0}^{N_i} V_i[j, k]$$

In a sub-step 20, a distortion value for the current dictionary is calculated.

In this sub-step 20, the driving vectors are quantized with the current dictionary, which is supplied by the preceding steps. The square error between the driving vectors and their quantized version forms the distortion measurement.

Sub-steps 16, 18 and 20 are then repeated iteratively until a maximum number of iterations ITERMAX is reached or the distortion is less than a tolerance threshold, the tests being carried out in a sub-step 22.

As indicated above, in the example, this step 10, in particular with the repetition of sub-steps 16, 18, 20 and 22, corresponds to the application of the generalized Lloyd-Max algorithm.

At the end of step 10, the method thus supplies a dictionary CITER, which is formed by iterative statistical analysis of the driving vectors.

Figure 2:
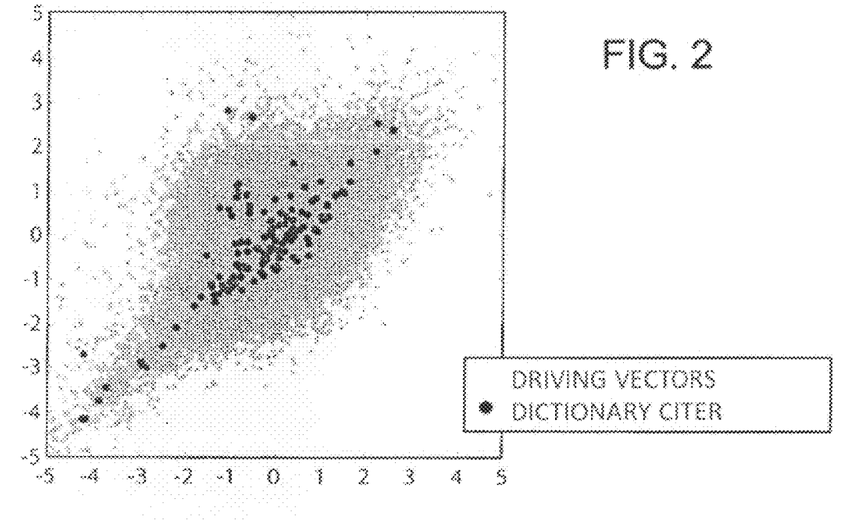
FIGS. 2 and 3 are representations of a dictionary at different steps of the method of the invention.

A representation in two dimensions of the dictionary CITER is given in FIG. 2, where the code vectors are represented by a cloud of points. In this representation, the grey points correspond to driving vectors or signal vectors, and black points to vectors of the dictionary. It can be seen that the distribution of the vectors of the dictionary CITER follows the density of the driving vectors, and that numerous vectors are close to each other.

The method then comprises a step 30 for modifying the dictionary CITER to impose a minimum distance between the code vectors two by two.

This modification step 30 comprises replacement of each of the code vectors by a neighbouring vector which is chosen on a regular lattice of points such as a cartesian grid. These modified vectors are also called rounded vectors. In the described embodiment, the chosen neighbouring vector is the vector which is placed on the nearest regular lattice to the code vector. Depending on embodiments and types of vectors, criteria other than the distance between the vectors can be used to determine the neighbouring vector of a code vector.

Thus, step 30 supplies a new dictionary C', which is obtained by rounding the dictionary CITER which was obtained at step 10, on the regular lattice.

Rounding code words on the regular lattice is carried out as follows, p being considered as the pitch of the lattice:

$$y'_i[k] = \left[\frac{y_i[k]}{p}\right] \times p$$

where i=1 ... M, k=1 ... n and [.] indicates rounding to the nearest integer.

The method then comprises a step 32 for eliminating duplicates from the modified code vectors forming the dictionary C'.

Step 32 comprises a sub-step for searching for duplicates, which is carried out on the whole of the dictionary C' by comparing each of the code vectors to other code vectors of the dictionary, and then a sub-step for suppressing duplicates.

At the end of this step 32, the dictionary C' may include fewer code vectors than the dictionary CITER.

The method then comprises a step 34 for merging the modified dictionary with the rounded driving vectors, in order to complete the dictionary if its size has been reduced.

This step 34 begins with a sub-step 36 for replacing each driving vector by a neighbouring vector, called a rounded driving vector, which is chosen on a regular lattice of points. Advantageously, the same lattice as that of step 30 is used. The rounded driving vectors are then ordered according to their frequency of appearance in a decreasing order, advantageously after having eliminated duplicates.

The method then comprises a sub-step 38 for combining the dictionary C' of modified code vectors with the rounded driving vectors. In the course of this sub-step, the dictionary C' is completed by adding rounded driving vectors which are not present in the dictionary, advantageously following the order of decreasing frequencies of appearance.

Thus, the dictionary C" is constructed so that a minimum distance is guaranteed between the centroids forming the code vectors of the dictionary, so that it is described as constrained. In the example, the parameters to be quantized are taken on a logarithmic scale, a constant pitch in this domain being equivalent to a logarithmic pitch in the energy domain, corresponding to the sensitivity of the human ear. By choosing the pitch p as a function of a perceptual threshold, it is therefore possible, thanks to the method of the invention, to generate a dictionary of statistical vector quantization taking account of the perceptual thresholds.

In addition, by combining the dictionary with the rounded driving vectors, a better distribution of the code vectors is obtained.

Figure 3:
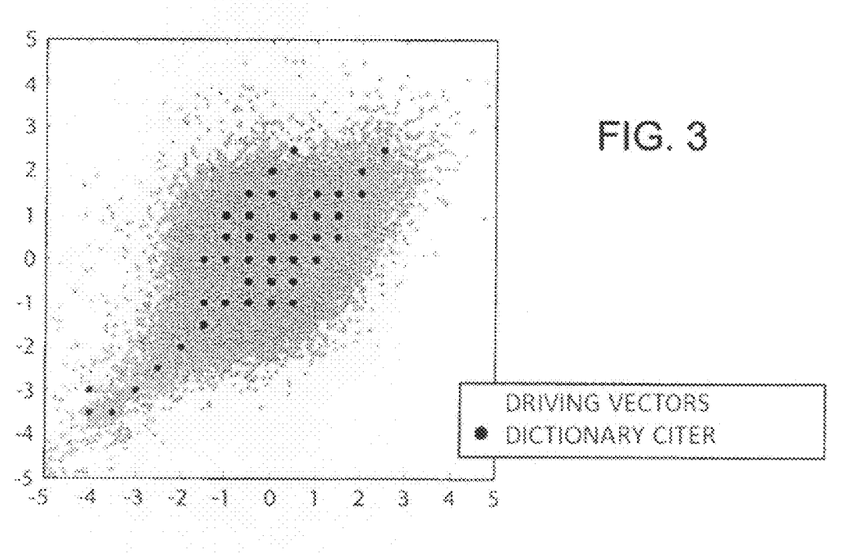

FIG. 3 represents the dictionary C" in the form of a cloud of points in two dimensions. It is noticeable in FIG. 3 that the dictionary C", which is obtained according to the method described above, covers a large area of the driving vectors, and has a minimum distance between the code vectors two by two.

The number of apparent points of the dictionary in FIG. 3 is less than that of FIG. 2 even if the two dictionaries in fact have the same number of code vectors. In fact, FIGS. 2 and 3 represent only the projection in two dimensions of vectors of a higher dimension. The code vectors of the dictionary shown in FIG. 3 being rounded on a regular lattice, several vectors are reduced to one point, which is not the case for the dictionary shown in FIG. 2.

Figure 4:
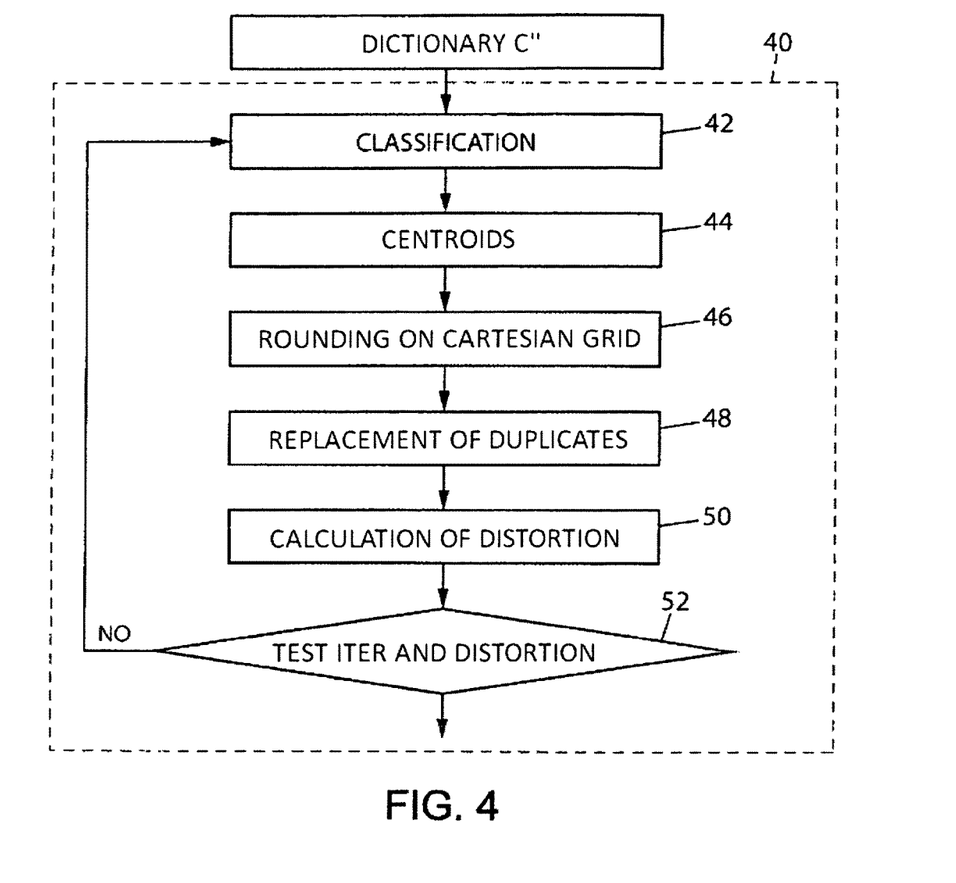
FIG. 4 is a flowchart of an optimization method.

Advantageously, the method also comprises a phase 40 for optimizing the dictionary C", and a flowchart of it is shown in FIG. 4.

The optimization begins with the reception of the dictionary C" as obtained at the end of the method which is described with reference to FIGS. 1 to 3.

This optimization phase consists, in the described embodiment, of repeating the same processing steps and applying them to the code vectors of the dictionary C". However, in the described optimization phase, at each iteration, the classification, the determination of the centroids, the modification of the code vectors and the elimination of duplicates are implemented.

Thus, phase 40 begins with a classification step 42, which is applied to the code vectors of the dictionary C", followed by a step 44 for determining the centroids. These steps 42 and 44 are similar to the steps 16 and 18 described above.

Next, a step 46 for modification by rounding on the regular lattice is carried out. This step 46 is followed by a step 48 for replacing duplicates.

Finally, the optimization phase comprises a step 50 for measuring the distortion, and a test 52 to determine whether the distortion is less than a tolerance threshold or a maximum number of iterations has been reached.

Such an optimization phase makes it possible to further improve the quality of the dictionary.

Of course, other embodiments are possible.

As a variant, the initial dictionary is created by pruning the rounded driving vectors on the regular lattice. This means that creation of this initial dictionary comprises replacement of the driving vectors by neighbouring vectors which are chosen on the regular lattice, and then selective elimination of the rounded driving vectors, as a function of their frequency of appearance.

In yet another variant, the optimization phase consists of repeating the method of FIG. 1 identically, using the previously obtained dictionary as the initial dictionary.

In another variant, the merging step is implemented between the modified code vectors and the unrounded driving vectors. However, in such an embodiment, the driving vectors which are used are chosen to guarantee maintenance of the minimum distance between the code vectors of the dictionary.

The method of generating a dictionary as described above can be implemented using a program for any type of calculator and computer.

Figure 5:
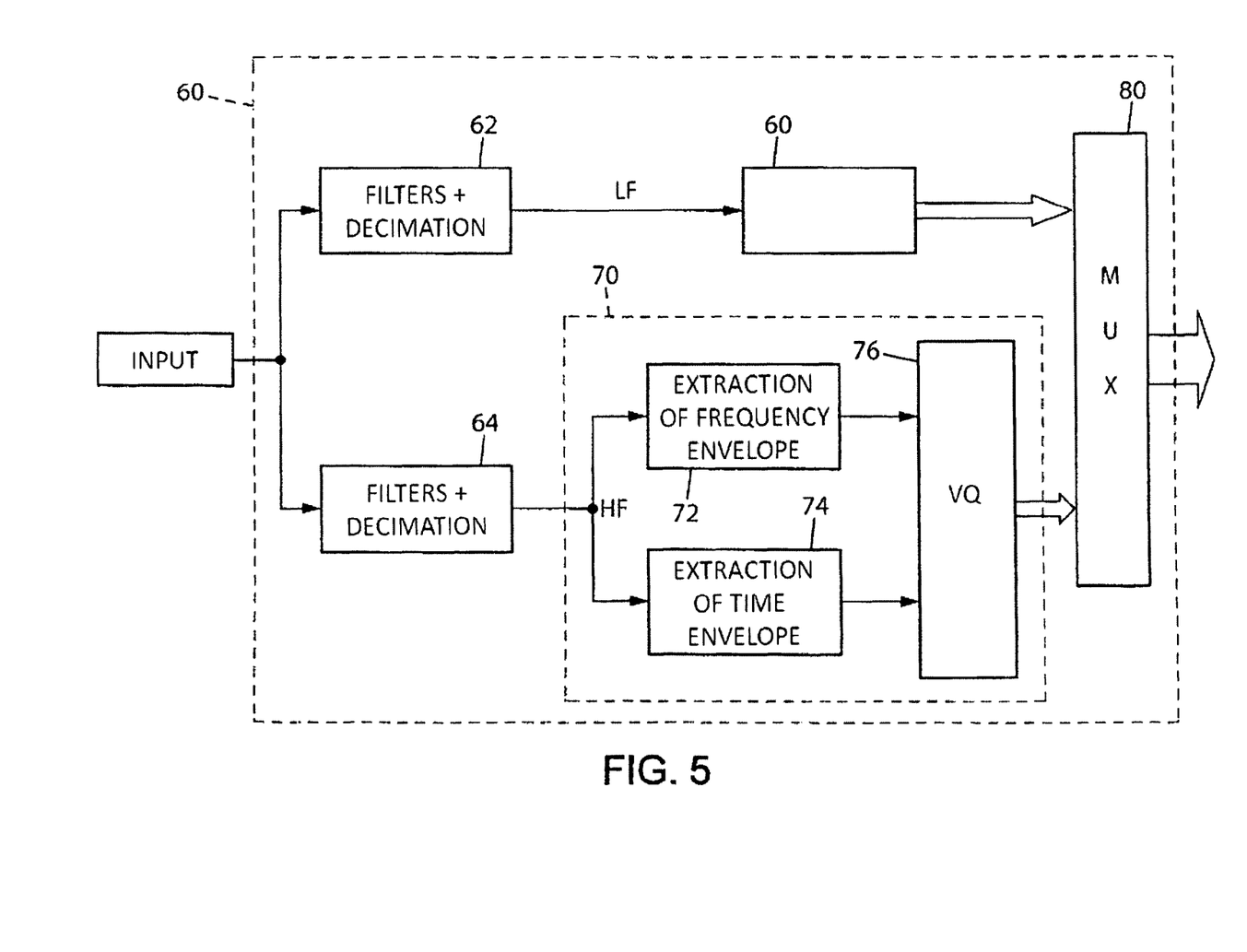
FIGS. 5 and 6 are block diagrams of an encoder and a decoder which implement the dictionary which is obtained by the method of the invention.
Figure 6:
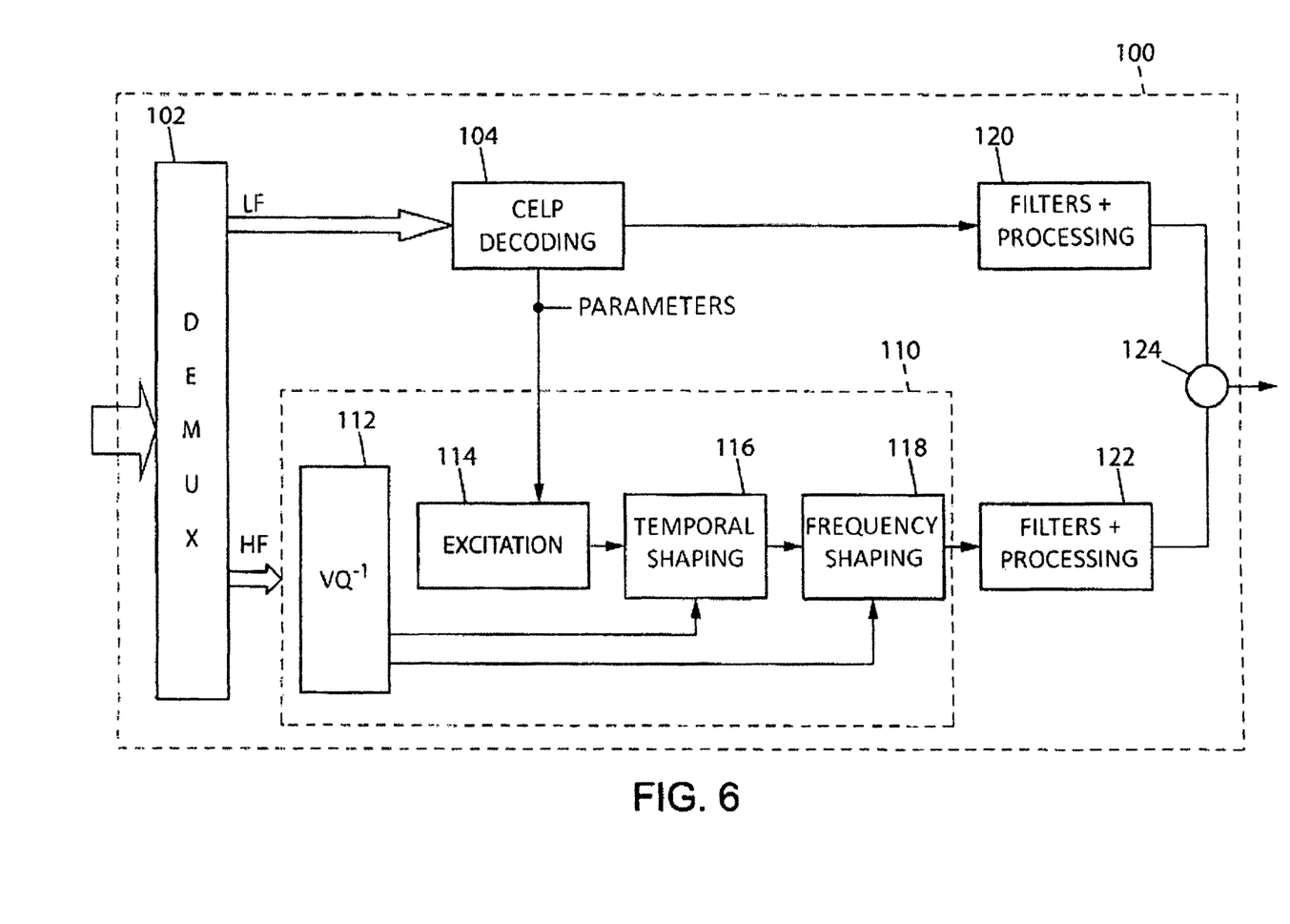

With reference to FIGS. 5 and 6, an encoder and a decoder which use dictionaries which are obtained according to the method of the invention are described.

These encoders and decoders are part of an overall system of hierarchical audio encoding and decoding in sub-bands, which functions at three possible speeds: 8, 12 or 13.65 kbit/s. In practice, the encoder always functions at the maximum speed of 13.65 kbit/s, whereas the decoder can receive the core at 8 kbit/s, as well as one or two enhancement layers at 12 or 13.65 kbit/s respectively.

The encoder 60 shown in FIG. 5 comprises two paths which receive the input signal. The first path comprises a filtering unit 62, which is suitable for extracting a low band LF of 0 to 4000 Hz from the signal. The second path comprises a similar unit 64, which is suitable for extracting a high band HF which extends from 4000 to 8000 Hz. These units 62 and 64 contain, for instance, filters and decimation modules which are implemented in the standard way.

The low band signal is then encoded, according to a standard CELP encoding such as an embedded CELP encoding of 8 to 12 kbit/s, in an encoding unit 66.

The high band signal is encoded, in particular, using vector quantization in a unit 70. In the described embodiment, the unit 70 is a parametric encoding unit, in which the encoded parameters are time and frequency envelopes of the signal, corresponding respectively to the effective value obtained by root mean square (r.m.s.) per sub-frame or sub-band of the high band signal. These envelopes are passed into a logarithmic domain as follows:

$$\sigma_{dB} = \frac{1}{2} \log 2(\sigma)$$

where $\sigma$ is the value of the envelope.

For each frame of the input signal, time and frequency envelope parameters are extracted in the parameter analysis modules 72 and 74. These parameters in the logarithmic domain are then quantized jointly in a vector quantization module 76, using dictionaries which are generated according to the invention.

More precisely, in the described embodiment, the parameters are encoded by a vector quantization called cartesian product with suppressed mean.

The mean $\mu$ of the time envelope vector is calculated, and then this mean is quantized. The quantized mean is symbolized by $\mu q$. The time and frequency envelope vectors are then centred on $\mu q$ before being quantized separately and multiplexed.

The mean $\mu$ is quantized by uniform scalar quantization, the pitch p=0.99657 of which is the perceptual threshold, that is the pitch of the regular lattice which is used to generate the dictionary.

The cartesian product vector quantization is carried out using the dictionary which was obtained according to the invention, and in which the stored code vectors are words with a minimum distance of p=0.99657, corresponding to a pitch of 6 dB.

The two paths HF and LF are then multiplexed in a multiplexer 80 to form the output signal of the encoder 60.

The corresponding decoder 100 is described with reference to FIG. 6.

This decoder comprises, first, a demultiplexer 102, which separates the paths corresponding to the low band and high band parts of the signal.

The path corresponding to the low band signal is fed into a CELP decoder 104. This CELP decoder also supplies the excitation parameters, which are calculated in a way which is standard per se.

The path corresponding to the high band signal is fed into a decoding unit 110, which uses, in particular, inverse vector quantization 112.

The output of this module 112 is supplied to a temporal shaping module 114. This module 114 also receives a synthetic excitation signal which is generated by a module 116 from CELP excitation parameters supplied by the CELP decoder 104.

Finally, the unit 110 comprises a frequency shaping module 118.

Symmetrically to the encoding of parameters, the decoding is done by denormalization of the time and frequency envelopes, which are dequantized by the dequantized mean.

Finally, the two paths are processed in processing modules 120 and 122, before being recombined with each other in a mixer 124.

The architecture and operation of such an encoder and such a decoder are standard per se, and will not be described in more detail here. A detailed description is given in the document UIT-T, COM 16, D214 (WP 3/16), "High level description of the scalable 8-32 kbit/s algorithm submitted to the Qualification Test by Matsushita, Mindspeed and Siemens," Q.10/16, Study Period 2005-2008, Geneva, 26 Jul.-5 Aug. 2005 (Source: Siemens).

The invention claimed is:

1. A method for generating a vector quantization dictionary for a signal of a type comprising a statistical analysis of driving vectors representing the signal determining a finite set of code vectors which are proxies for said driving vectors, wherein the method comprises modifying, by a processor, said finite set of code vectors to impose a minimum distance between the modified code vectors two by two, these modified code vectors forming said dictionary.

2. The method according to claim 1, wherein the statistical analysis comprises creating an initial dictionary, classifying said driving vectors starting from the initial dictionary in order to form quantization regions, and determining a centroid for each region, said centroids being said code vectors.

3. The method according to claim 2, wherein said creating an initial dictionary is implemented starting from said driving vectors, and comprises replacement of each driving vector by a rounded vector which is chosen on a regular lattice of points, and selective elimination of rounded vectors as a function of their frequency of appearance.

4. The method according to claim 3, wherein said regular lattice of points has a pitch which corresponds to a level of sensitivity of a receiver which is the destination of said signal.

5. The method according to claim 1, wherein the statistical analysis also comprises calculating the distortion of the initial dictionary and comparing this distortion with a tolerance threshold, said statistical analysis being repeated if said comparison is negative.

6. The method according to claim 1, wherein the modification comprises replacing each of said code vectors of the finite set by a neighbouring code vector which is chosen on a regular lattice of points.

7. The method according to claim 1, further comprising eliminating duplicates among said modified code vectors.

8. The method according to claim 7, wherein said eliminating duplicates comprises searching for duplicates by comparing the modified code vectors with each other, and deleting the duplicates as a function of their frequency of appearance.

9. The method according to claim 1, further comprising merging the modified code vectors with the driving vectors which have at least said minimum distance between them, and with said modified code vectors.

10. The method according to claim 9, wherein the merging comprises replacing each driving vector by a rounded vector which is chosen on a regular lattice of points, and combining the modified code vectors and rounded driving vectors.

11. The method according to claim 10, wherein said merging also comprises ordering the rounded driving vectors according to their frequency of appearance, and selecting a finite number of these vectors in order to combine them with the modified code vectors.

12. The method according to claim 10, wherein said combining comprises adding to said modified code vectors a finite number of rounded driving vectors, which are distinct from said modified code vectors.

13. The method according to claim 1, further comprising optimizing said dictionary, which is formed from said modified code vectors.

14. The method according to claim 13, wherein optimizing comprises calculating the distortion of the dictionary, and comparing this distortion with a tolerance threshold, said statistical analysis and modification being repeated if said comparison is negative.

15. The method according to claim 13, wherein optimizing comprises at least one iteration of the method which is implemented on the basis of the dictionary which is formed from said modified code vectors.

16. A vector quantization dictionary, comprising code vectors which are proxies for driving vectors which represent a signal, wherein it is obtained by a method according to claim 1.

17. A non-transient computer program medium to generate a vector quantization dictionary of a signal, comprising code instructions to implement a method according claim 1 when it is executed on a computer.

18. The method of encoding a signal, comprising at least analysing the signal in order to obtain representative parameters from it, wherein at least one of said representative parameters is encoded by vector quantization using a dictionary which is generated by a method according to claim 1.

19. A signal encoder, comprising at least means for analysing the signal in order to obtain representative parameters from it, further comprising means for encoding at least one of said representative parameters by vector quantization using a dictionary which is generated by a method according to claim 1.

20. The method of decoding a signal, comprising at least processing representative parameters of said signal, wherein at least one of said representative parameters is decoded by inverse vector quantization using a dictionary which is generated by a method according to claim 1.

21. A signal decoder, comprising at least means for processing representative parameters of said signal, further comprising means for decoding at least one of said representative parameters by inverse vector quantization using a dictionary which is generated by a method according to claim 1.

* * * * *